United States Patent [19]

Peavey et al.

[11] Patent Number: 4,774,164
[45] Date of Patent: Sep. 27, 1988

[54] CHROME MASK ETCH

[75] Inventors: Paula E. Peavey; Jerris H. Peavey, both of Novato, Calif.

[73] Assignee: Tegal Corporation, Petaluma, Calif.

[21] Appl. No.: 34,250

[22] Filed: Apr. 6, 1987

[51] Int. Cl.$^4$ .............................................. G03C 5/00
[52] U.S. Cl. .................................... 430/296; 430/323; 430/324; 430/330; 156/643; 156/646; 156/657.1
[58] Field of Search ................ 156/643, 646, 659.1; 430/323, 324, 329, 314, 315, 317, 318, 296, 330

[56] References Cited

U.S. PATENT DOCUMENTS

| | | | |
|---|---|---|---|
| 3,567,447 | 3/1971 | Chand | 430/321 X |
| 4,489,146 | 12/1984 | Bock et al. | 430/5 |
| 4,634,645 | 1/1987 | Matsuda et al. | 430/30 |

Primary Examiner—José G. Dees
Attorney, Agent, or Firm—Paul F. Wille

[57] ABSTRACT

Patterning a chrome mask with PBS (polybutenesulfone) photoresist is enabled in a plasma reactor by covering the patterned photoresist with a glass layer, planarizing the glass layer, etching the photoresist and then etching the chrome mask. The pattern transferred to the chrome mask is the negative or inverse of the pattern in the photoresist layer.

8 Claims, 1 Drawing Sheet

CHROME MASK ETCH

BACKGROUND OF THE INVENTION

This invention relates to the manufacture of semiconductor devices and, more particularly, to the manufacture of chrome masks for use in making semiconductor devices.

As is known in the art, semiconductor devices are formed by a variety of sequential steps in which a semiconductor wafer is subjected to various treatments such as doping, etching, oxidizing, or depositing various layers. Many, if not all, of these operations are not carried out on the entire wafer, only selected portions of the wafer. Which portions get treated depend upon the pattern formed in a layer of photoresist, typically an organic polymer, overlying the wafer.

The photoresist is patterned, as the name implies, by selectively exposing it to actinic radiation which causes polymerization of many of its molecules and, hence a change in etch rate between exposed and unexposed areas. The photoresist is then exposed to a suitable etchant to erode the photoresist and expose the underlying layer in the selected areas. The actinic radiation may comprise heat, visible light, ultraviolet light, X-rays or an electron beam. In some applications, such as using an electron beam, the wafer may be directly written upon or scanned by the electron beam to form the requisite pattern. More typically, a photomask is used. The photomask is usually a patterned chrome layer overlying a glass or quartz substrate. Radiation passes through the substrate and the shadow of the pattern on the photomask falls on the photoresist. The photomask may or may not contact the photoresist.

In the manufacture of semiconductor devices, particularly integrated circuits (IC's), the geometry of the patterns in the photomask is getting progressively smaller. The current state of the art is that the pattern is formed on the photomask by writing on the photomask with an electron beam. A problem has developed in that wet etch chemistries do not permit etching features smaller than about two microns. Wet chemical etches are isotropic. The result is significant undercutting of the photoresist, which changes the geometry of the pattern one is trying to form in the chrome layer. While tolerable for large geometry patterns, the undercutting becomes a significant percentage of the small geometry pattern. While a dry etch or plasma etch can provide an anisotropic etch, the electron beam (e-beam) photoresists used cannot tolerate a plasma. The photoresist, e.g. PBS (polybutenesulfone), decomposes in a plasma and definition is lost.

In view of the foregoing, it is therefore an object of the present invention to provide a process for etching chrome photomasks in a plasma reactor.

Another object of the present invention is to provide a process for etching high resolution chrome photomasks.

A further object of the present invention is to provide a plasma etch process for retaining definition despite decomposable photoresists.

Another object of the present invention is to provide a process for etching PBS in a plasma.

A further object of the present invention is to provide a process for producing a positive image from a positive photoresist

SUMMARY OF THE INVENTION

The foregoing objects are achieved in the present invention wherein a layer of photoresist is applied to a substrate having a chrome layer thereon. The photoresist is patterned and then covered with glass. The glass is etched down to the thickness of the photoresist, transferring the pattern to the glass. The photoresist is removed and the chrome layer subjected to a substantially anisotropic etch in a plasma reactor, thereby patterning the chrome layer. The remaining glass may then be removed.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
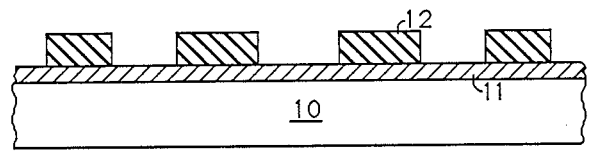
FIGS. 1–5 illustrate a preferred embodiment of the steps of a process in accordance with the present invention.

As illustrated in FIG. 1, substrate 10, which preferably comprises glass or quartz, has deposited thereon layer 11, which typically comprises chrome. Substrate 10 is typically 90 mils thick, while chrome layer 11 is typically 800 to 900 angstroms thick. Layer 12 of photoresist, such as PBS, is formed on layer 11 and patterned in a wet chemical etch as described above. Photoresist layer 12 is preferably 3000 to 4000 angstroms in thickness, which is somewhat thinner than the typical thickness of this layer in the prior art. Since PBS is a positive photoresist and it is desired to obtain a positive image, layer 12 is patterned with the inverse image. This is readily accomplished, as known in the art, by a setting on the e-beam machine. Except for layer 12 being an inverted image, the structure of FIG. 1 with which the process of the present invention starts, is similar to the structure in prior art processes.

Figure 2:
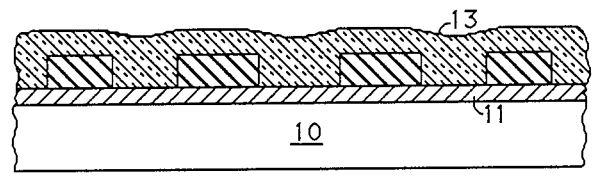

FIG. 2 illustrates the next step in the process in accordance with the present invention wherein layer 13 of glass is deposited over layer 12 to a thickness greater than the thickness of layer 12. Layer 13 can be formed in any suitable manner, for example, by using a spin-on glass. In one embodiment of the present invention, layer 13 comprised what is known in the art as Accuglass 203 as commercially available from Allied Chemicals. The glass was applied using a spin-coater turning at 4000 rpm to provide a glass layer having a thickness over the photoresist of approximately 1000 to 2000 angstroms. For the particular glass used, this corresponds to a spin of about 20 seconds duration. As understood by those of skill in the art, a wide variety of combinations of glass viscosity and spin speeds will produce the same final thickness of glass.

After the glass layer is applied, its density can be increased by baking it, e.g. at 120 degrees Centigrade for approximately 30 minutes. This not only may increase the density of the glass but tend to smooth it somewhat. Alternatively, the baking can take place between the steps of FIGS. 3 and 4. This permits a higher bake temperature, e.g. 400° C., than for a bake in the presence of photoresist 12. It is understood by those of skill in the art that the illustration of FIG. 2 is somewhat idealized in that the actual pattern of photoresist does not have vertical sidewalls.

Figure 3:
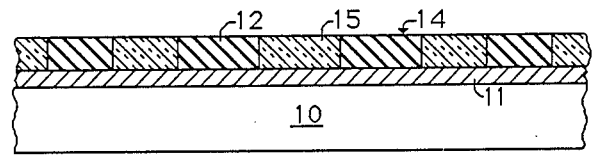

As illustrated in FIG. 3, glass layer 13 is then etched down to the thickness of layer 12 in an operation known as planarization. It is necessary for the following step that the etch of layer 13 be sufficient to assure that upper surface 14 of photoresist layer 12 is fully uncovered to expose the pattern contained in layer 12. Upon planarization, layer 13 is no longer continuous across the surface of the substrate but comprises a plurality of separate areas, such as area 15.

The planarization of layer 13 can be carried out with a relatively standard etch in a plasma reactor. For example, an etch utilizing 10 SCCM of $CHF_3$, 20 SCCM of $C_2F_6$, and 30 SCCM of helium at a pressure of 2 torr and a power of 400 watts at 13.56 MHz provided adequate planarization of layer 13 in 15–30 seconds.

Figure 4:
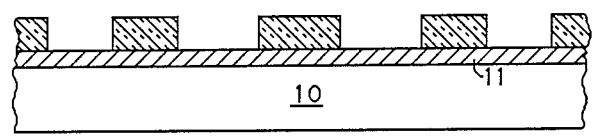

As illustrated in FIG. 4, the photoresist is then removed exposing areas of chrome layer 11. In practice, some of the photoresist is removed as a result of the previous treatment of the substrate which has the effect of decomposing photoresist 12. Any photoresist remaining on layer 11 is decomposed by the following step in which layer 11 is exposed to a plasma etch.

Figure 5:
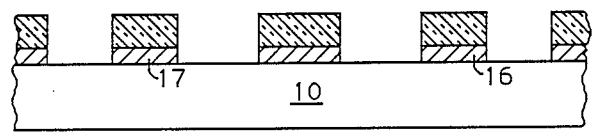

FIG. 5 illustrates the result of etching chrome layer 11 to form a plurality of separate regions such as regions 16 and 17. Chrome layer 11 may be etched in any suitable mixture of gases. For example, in one embodiment of the present invention, chrome layer 11 was etched in a mixture of 20 SCCM carbon tetrachloride and 20 SCCM carbon dioxide at a pressure of 300 millitorr at a power of 220 watts. Under these conditions, layer 11 was etched into regions 16 and 17 in approximately 1 minute. In addition, any PBS overlying chrome layer 11 was also removed.

Figure 6:
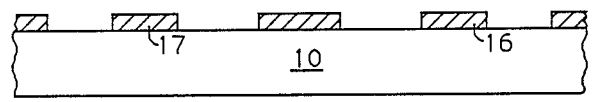
FIG. 6 illustrates an optional final step.

FIG. 6 illustrates an optional additional step in which the remainder of glass layer 13 is removed. For other applications, where substrate 10 does not comprise glass or quartz or wherein it is protected by another layer, the remainder of glass layer 13 is easily removed. Otherwise, the etch rate of layer 13 should be considerably higher than the etch rate of substrate 10.

As can be seen by comparing FIGS. 6 and 1 the pattern formed in the chrome layer is the inverse of the pattern formed in photoresist layer 12. Thus, in accordance with the present invention, one can invert the image in a photoresist layer by using the process of the present invention. For negative resists, the image is reversed by the resist, not by the writing mechanism.

There is thus provided by the present invention a process which enables one to use a decomposable photoresist with minimal or no loss of definition.

Having thus described the invention, it will be apparent to those of ordinary skill in the art that various modifications can be made within the scope of the present invention. For example, while described in conjunction with PBS as the photoresist, it is understood that the present invention can be used with any photoresist meeting the needs of the particular situation. For example, there are several e-beam photoresists including PBS and COP. Alternatively, optical photoresists can be used. Similarly, the present invention can be used to make masks for projection, contact, or step and repeat type operations. In addition, the present invention is useful in direct write on wafer systems. While used to pattern a metal layer for making masks, any layer can be patterned provided it can be selectively etched in the presence of glass layer 13.

We claim:

1. A process for plasma etching a first layer in the presence of a patterned, decomposable mask layer comprising the steps of:
    covering said first layer and said mask layer with a layer of glass to fill the pattern in said mask layer;
    planarizing said glass layer so that the upper surface of said glass layer is approximately the same height as said mask layer;
    removing said mask layer to expose portions of said first layer and etching said exposed portions of said first layer by contacting said mask layer with a plasma glow discharge to remove the mask layer and continuing said discharge to etch said first layer.

2. The process as set forth in claim 1 wherein said etch of the first layer is anisotropic.

3. The process as set forth in claim 1 wherein said covering step comprises spinning on a glassy slurry and baking the layer to increase the density thereof.

4. The process as set forth in claim 1 wherein said first layer comprises chrome and said glow discharge is in a gas mixture comprising $CCl_4$ and $CO_2$.

5. The process as set forth in claim 1 wherein said covering step comprises:
    coating said first layer to a thickness of 100–200 nm. over the pattern in said mask layer.

6. The process as set forth in claim 1 wherein said mask layer comprises e-beam photoresist.

7. The process as set forth in claim 6 wherein said mask layer comprising poly(olefin sulfone).

8. The process as set forth in claim 7 wherein said mask layer comprises PBS.

* * * * *